US008334150B2

(12) United States Patent
Kuan et al.

(10) Patent No.: US 8,334,150 B2
(45) Date of Patent: Dec. 18, 2012

(54) WAFER LEVEL LASER MARKING SYSTEM FOR ULTRA-THIN WAFERS USING SUPPORT TAPE

(75) Inventors: Heap Hoe Kuan, Singapore (SG); Byung Tai Do, Singapore (SG)

(73) Assignee: Stats Chippac Ltd., Singapore (SG)

( * ) Notice: Subject to any disclaimer, the term of this patent is extended or adjusted under 35 U.S.C. 154(b) by 841 days.

(21) Appl. No.: 11/163,156

(22) Filed: Oct. 7, 2005

(65) Prior Publication Data

US 2007/0080450 A1    Apr. 12, 2007

(51) Int. Cl.
*G01R 31/26* (2006.01)
*H01L 21/66* (2006.01)

(52) U.S. Cl. ............... 438/15; 438/55; 257/E21.525; 257/E23.179

(58) Field of Classification Search ............ 438/55, 438/15; 257/E23.179, E21.525
See application file for complete search history.

(56) References Cited

U.S. PATENT DOCUMENTS

| 5,570,293 | A  | * | 10/1996 | Tanaka et al. | 700/121 |
| 6,461,690 | B2 |   | 10/2002 | Corbett | 427/511 |
| 6,524,881 | B1 |   | 2/2003 | Tandy et al. | 438/69 |
| 6,585,927 | B2 |   | 7/2003 | Grigg et al. | 264/401 |
| 6,621,147 | B2 |   | 9/2003 | Ball | 257/622 |
| 6,692,978 | B2 | * | 2/2004 | Tandy et al. | 438/26 |
| 6,710,364 | B2 |   | 3/2004 | Guldi et al. | 250/599.4 |
| 6,744,144 | B2 |   | 6/2004 | Peterson | 257/797 |

* cited by examiner

*Primary Examiner* — Matthew Landau
*Assistant Examiner* — Vicki B Booker
(74) *Attorney, Agent, or Firm* — Ishimaru & Associates LLP; Mikio Ishimaru

(57) ABSTRACT

A wafer level marking system is provided including: providing a wafer, a wafer frame, and a support tape; mounting the wafer and the wafer frame on the support tape; and marking the wafer through the support tape.

20 Claims, 5 Drawing Sheets

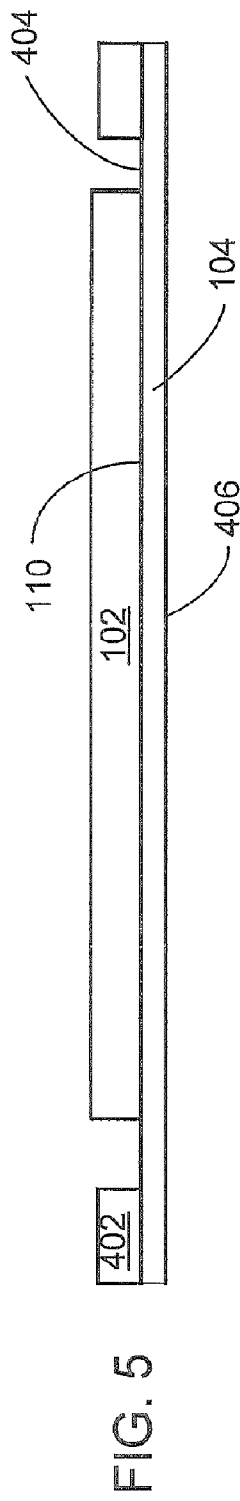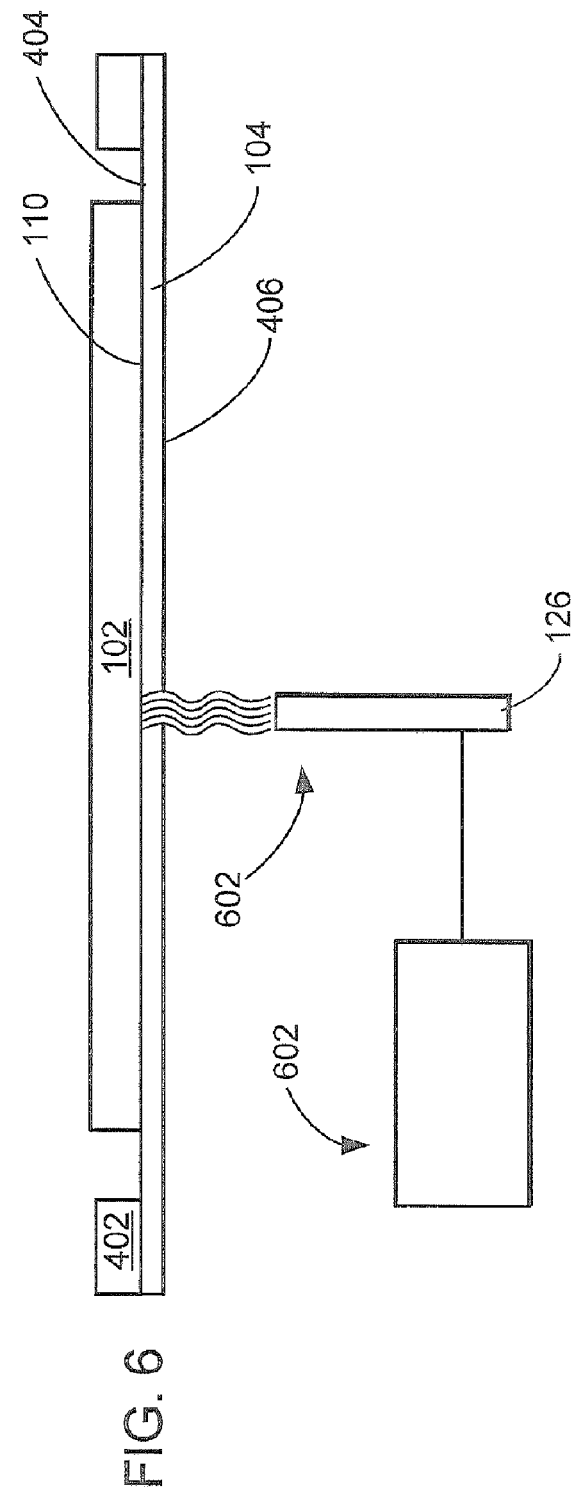

WAFER LEVEL LASER MARKING SYSTEM FOR ULTRA-THIN WAFERS USING SUPPORT TAPE

TECHNICAL FIELD

The present invention relates generally to integrated circuit wafers and more particularly to ultra-thin integrated circuit wafers.

BACKGROUND ART

Modern consumer electronics, such as cellular phones, digital cameras, and music players, require shrinking integrated circuits and packing more integrated circuits into an ever shrinking physical space. Numerous technologies have been developed to meet these requirements. One of these technologies involves making the integrated circuits as thin as possible.

Consequently, integrated circuit wafers are fabricated to be as thin as possible with processes often referred to as thinning, backgrinding, lapping, or backlapping to name a few. Some of these processes are applied to the wafers prior to fabricating the integrated circuits on the wafers while others occur afterwards. The resultant thin wafers are prone to bowing or warpage due to many factors including the sheer thinness of the wafers.

Furthermore, the wafer warpage creates a myriad of problems from fabrication through the integration of the integrated circuits into the end consumer electronic products. One such problem is placing identifying marks on the wafers to be used for identification throughout manufacturing and through to integration into the end consumer electronics products. The warpage variations create problems for the marking systems to accurately and clearly place identifying marks on the wafer.

Numerous approaches attempting to solve the wafer warpage and marking problems exist. Some of the approaches trying to solve the wafer warpage problem require additional physical structures on the active side or back side of the wafer. Although these structures alleviate warpage, they also limit the integrated circuit size on the wafer and the yield from each wafer.

An approach to try to solve the marking problem provides a marking tape where the surface of the marking tape facing the wafer contains pigmentation, which reacts to an applied laser to leave inked identifying marks on the wafers. Although this approach utilizes a laser and a tape for wafer markings, it does not provide clear identifying marks because the identifying marks are still affected by wafer warpage.

Thus, a need still remains for compensating for the wafer warpage in ultra-thin wafers. There also remains the need for accurate marking of ultra-thin wafers. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a wafer level marking system including: providing a wafer, a wafer frame, and a support tape; mounting the wafer and the wafer frame on the support tape; and marking the wafer through the support tape.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 5 is a cross-sectional view of the first support tape with the thinned wafer attached, within the first wafer frame;

FIG. 6 is a cross-sectional view of a wafer level marking device for a thinned wafer using the first support tape, in a wafer level marking phase;

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. Generally, the device can be operated in any orientation. The same numbers are used in all the figures to relate to the same elements.

The term "horizontal" as used herein is defined as a plane parallel to the conventional plane or surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
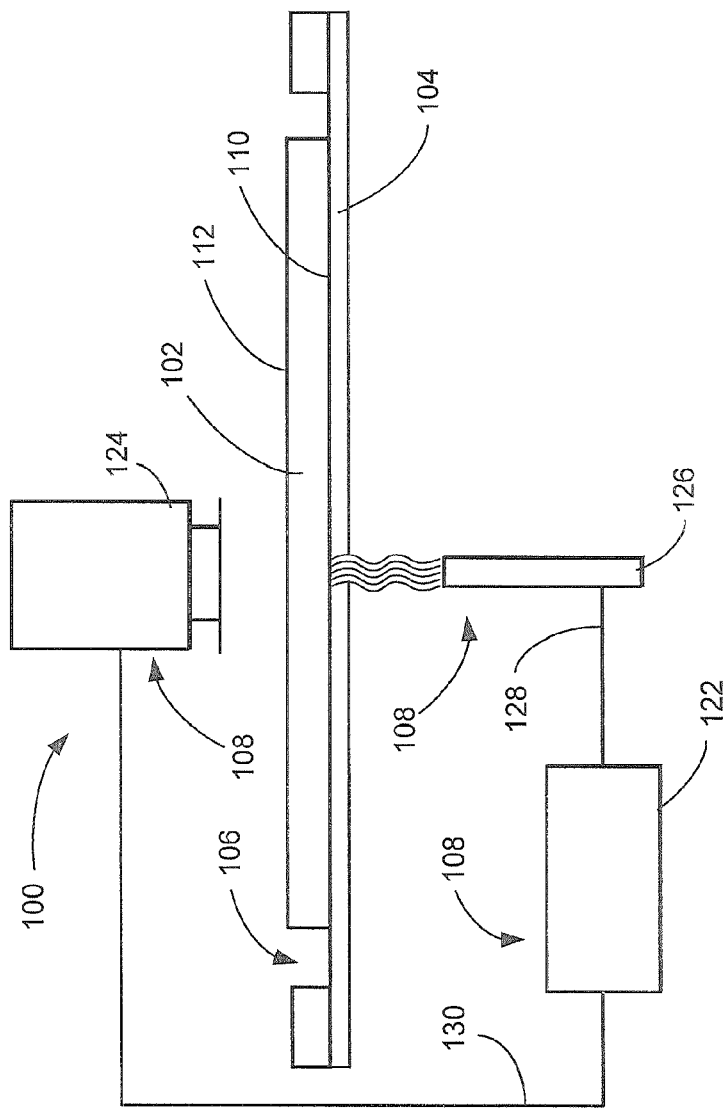
FIG. 1 is a cross-sectional view of a wafer level marking system for a thinned wafer using a first support tape.

Referring now to FIG. 1, therein is shown a cross-sectional view of a wafer level marking system 100 for a thinned wafer 102 using a first support tape 104. The wafer level marking system 100 includes the thinned wafer 102, having a back side 110 and an active side 112, the first support tape 104, such as a dicing tape, a first wafer frame mount device 106, and a laser marking system 108. The first support tape 104 comprises a material having structural integrity for planar rigidity to resist warpage and a tolerance to the application of laser optical energy. The laser marking system 108 may be generally referred to as a computer controlled marking system.

The laser marking system 108 includes a control device 122, such as a computer, a camera 124, and a laser source 126. The control device 122 communicates to the camera 124 for positioning and alignment adjustments and to the laser source 126. The laser source 126 generates the identifying marks through the first support tape 104 on the back side 110 of the thinned wafer 102. The control device 122 utilizes a laser communication link 128 to the laser source 126 and a camera communication link 130 to the camera 124.

It is understood the control device 122 may be a preprogrammed device, a specialized compute device, a general-purpose compute device, or a combination thereof to execute the desired function. Yet further, it is understood that the laser communication link 128 and the camera communication link 130 may be wired or wireless or a combination thereof. It is also understood the laser communication link 128 and the camera communication link 130 may not be a direct connection between the control device 122, the laser source 126, and the camera 124, such as the communication over a network or a combination thereof. It is also understood there may be other elements of the laser marking system 108 not describe for brevity, such as in mechanical and robotic elements.

Figure 2:
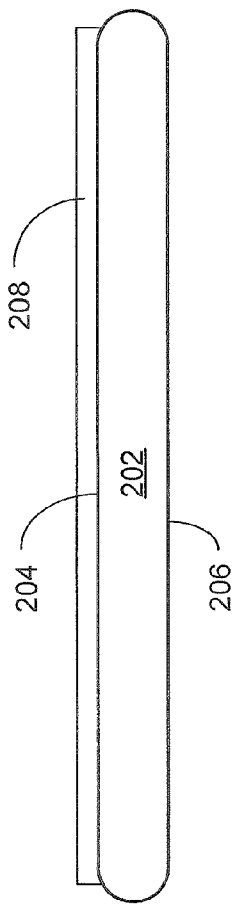
FIG. 2 is a cross-sectional view of a full wafer in an intermediate phase of manufacturing.

Referring now to FIG. 2, therein is shown a cross-sectional view of a full wafer 202 in an intermediate phase of manufacturing. The cross-sectional view of the full wafer 202 depicts the full wafer 202 having an active side 204 and an unprocessed side 206 and a second support tape 208, such as a backgrinding tape. The active side 204 has a metal layer and/or polyimide layer over the integrated circuit elements, such as transistors (not shown). The full wafer 202 has an initial thickness range, such as 660 μm to 740 μm. Due to constraints in packaging and functional performance the unprocessed side 206 of the full wafer 202 will be subjected to a backgrind process that will reduce its thickness by 86% to 96%. It is understood that there may be instances when a different percentage of the wafer is subjected to the backgrinding process.

The second support tape 208, such as a backgrinding tape, is adhered to the active side 204 covering and protecting the integrated circuit elements that have been fabricated there. The second support tape has a thickness of 200 μm to 250 μm. The presence of the second support tape 208 on the active side 204 of the full wafer 202 provides planar rigidity to the full wafer 202 during the backgrind or "thinning" process.

Figure 3:
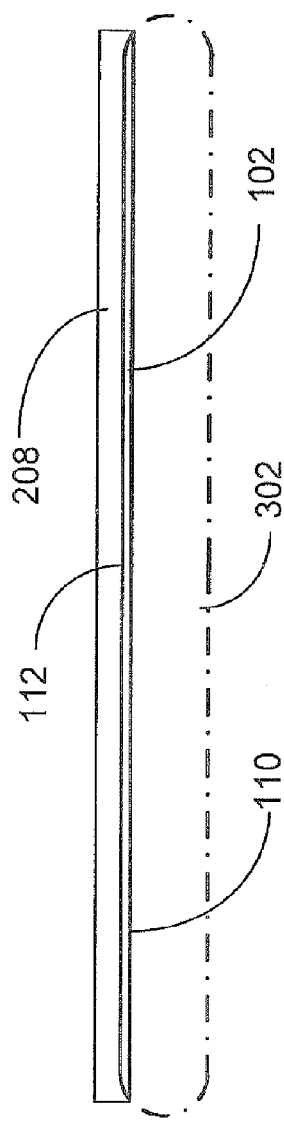
FIG. 3 is a cross-sectional view of the thinned wafer 102, in a thinning phase.

Referring now to FIG. 3, therein is shown a cross-sectional view of the thinned wafer 102, in a thinning phase. The cross-sectional view of the thinned wafer 102 depicts the second support tape 208 attached to the active side 112 of the thinned wafer 102 and the back side 110. A dashed line 302 is for reference only and shows the original thickness of the full wafer 202 (not shown). The wafer thickness has been reduced to the range of 25 μm to 100 μm. This resultant thickness range is prone to warpage, wafer breakage, and the edge of the thinned wafer 102 chipping. The second support tape 208 provides planar rigidity to the thinned wafer 102, resisting the tendency to warp and break.

Figure 4:
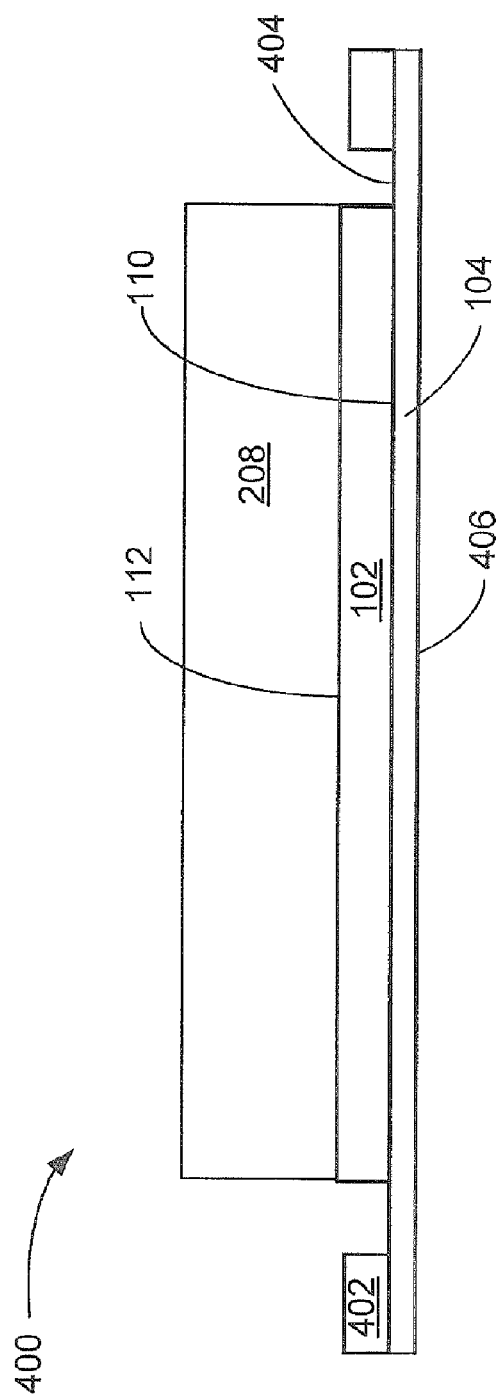
FIG. 4 is a cross-sectional view of a first wafer frame mount device with thinned wafer mounted, in a frame attaching phase.

Referring now to FIG. 4, therein is shown a cross-sectional view of a first wafer frame mount device 400 with thinned wafer 102 mounted, in a frame attaching phase. The cross-sectional view of the first wafer frame mount device 400 depicts the thinned wafer 102, with the second support tape 208 attached, mounted on the first support tape 104, such as a dicing tape. The first support tape, having a contact side 404 and a laser side 406, is mounted on a first wafer frame 402 by overlaying the back side 110 of the thinned wafer 102 and the first wafer frame 402 with the first support tape 104. A roller is then used to bond the first support tape to the wafer frame and the back side 110 of the thinned wafer 102.

The back side 110 of the thinned wafer 102 attaches to the contact side 404 of the first support tape 104. The first support tape 104 provides additional structural support and planar rigidity to the thinned wafer 102 in order to minimize the wafer warpage. The second support tape 208 will be removed, or detaped, from the active side 112 while the first support tape 104 is attached to the back side 110. The first support tape 104 further includes the laser side 406. The first wafer frame 402 secures the first support tape 104 and may provide additional structural reinforcement to provide planar rigidity to the first support tape 104 and the thinned wafer 102.

The thinned wafer 102 is in a frame attaching phase. This frame attaching phase of manufacturing provides that the thinned wafer 102 remains supported by the first support tape 104 and the second support tape 208. In this transitional step, the second support tape 208 will be removed while the first support tape 104 maintains the planar rigidity required to resist warping and breaking the thinned wafer 102.

Referring now to FIG. 5, therein is shown a cross-sectional view of the first support tape 104 with the thinned wafer 102 attached, within the first wafer frame 402. The cross-sectional view depicts the first support tape 104 comprising one material that resists warpage and allows the laser source 126 (not shown) to generate the identifying marks through the first support tape 104.

The first support tape 104 adheres to the thinned wafer 102 and provides sufficient structural integrity to provide planar rigidity for mitigating wafer warpage while avoiding tearing or significant stretching. The first support tape 104 minimizes various warpage, such as concave, convex, or a combination thereof, known as "potato chip". The application of the first support tape 104 creates a homogeneous surface on the back side 110 of the thinned wafer 102 suitable for the formation of an optical energy-induced mark, such as that formed by the laser source 126 shown in FIG. 1.

For illustrative purposes, the first support tape 104 is described as having the contact side 404 and the laser side 406 with only one layer, although it is understood the first support tape 104 may be one or more layers of similar or different materials. It is further understood that the first support tape 104 may be constructed with one or more application of the first support tape 104, repeatedly, or with different types of materials or a combination thereof.

Referring now to FIG. 6, therein is shown a cross-sectional view of a wafer level marking device 602 for a thinned wafer 102 using the first support tape 104, in a wafer level marking phase. The cross-sectional view of the wafer level marking device 602 shows the thinned wafer 102 attached to the first support tape 104 and the first wafer frame 402. The laser source 126 is in a write operation to deposit identifying marks through the first support tape 104 on the back side 110 of the thinned wafer 102.

The laser source 126, shown in FIG. 1, directly generates the identifying marks through the first support tape 104 by application of optical energy from the laser source 126 to the back side 110 of the thinned wafer 102 through the first support tape 104 and without combustion. Any combustion or incineration of the first support tape 104 may result in lost structural integrity and planar rigidity. The contact side 404 tolerates thermal increases, such as those resulting from the optical energy from the laser source 126, to avoid separation from the back side 110 of the thinned wafer 102.

Additionally, the first support tape 104 may absorb, dissipate, reflect, or withstand the optical energy from the laser source 126. The first support tape 104 may allow the optical energy to pass through the first support tape 104 such as having transparent or translucent qualities to the applied optical energy. The first support tape 104 may provide controlled or limited incineration resulting from the applied optical energy. Yet further, the first support tape 104 may provide pigmentation activated and deposited on the back side 110 of the thinned wafer 102 upon exposure to the laser source 126, shown in FIG. 1.

Figure 7:
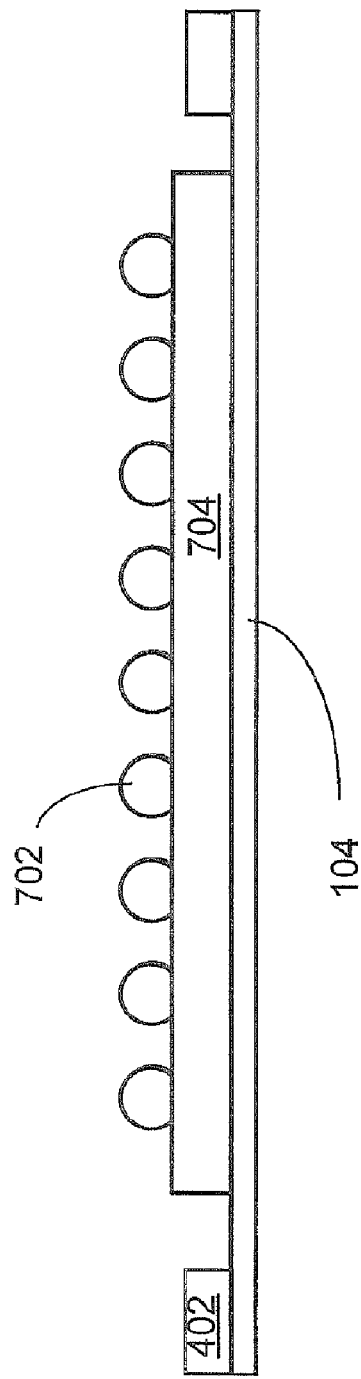
FIG. 7 is a cross-sectional view of an alternative wafer attached to the first support tape.

Referring now to FIG. 7, therein is shown a cross-sectional view of an alternative wafer 704 attached to the first support tape 104. The wafer level marking system 100 (not shown) supports various wafer structures for different types of packages, such as the thinned wafer 102 for wire bond packaging as shown in FIG. 1, or in the alternate wafer 704 for flip-chip, wafer level chip scale, stacked, or non-stacked packaging (not shown) having an electrical interconnect 702 attached. For illustrative purposes, the electrical interconnect is shown as a solder bump, though it could be any of the following as well: a stud bump, a solder column interposer or a contact matrix interposer.

For illustrative purposes the alternate wafer 704 is shown with the electrical interconnect 702, as a solder bump in multiple numbers, although it is understood that any number of the electrical interconnect 702 may be used, as well.

Figure 8:
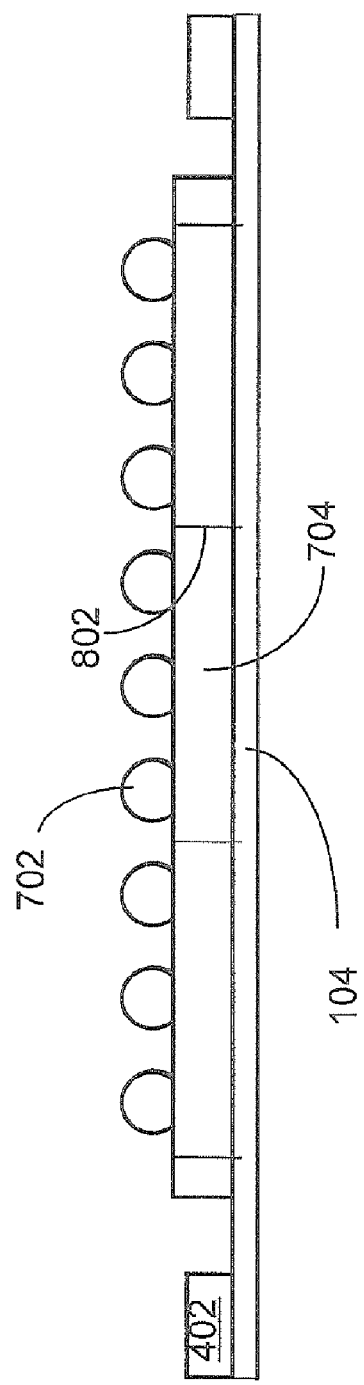
FIG. 8 is a cross-sectional view of the alternative wafer of FIG. 7, in a singulation phase of manufacturing.

Referring now to FIG. 8, therein is shown a cross-sectional view of the alternative wafer 704 of FIG. 7, in a singulation phase of manufacturing. The cross-sectional view of the alternate wafer 704 depicts the first support tape 104 attached to the first wafer frame 402 and the alternate wafer 704 having electrical interconnect 702. A singulation line 802 divides the alternate wafer 704 into individual instantiations of a function. The singulation line 802 has completely penetrated the alternate wafer 704 and cut into the first support tape 104, but hasn't completely penetrated it. The first support tape 104 remains intact through the wafer marking process and the singulation process.

The role of the first support tape 104 has changed from providing planar rigidity to a role of maintaining the position of the dice. The individual parts are now ready for release from the first support tape 104. A release process, such as ultra-violet (UV) release, will free the dice from the first support tape.

Figure 9:
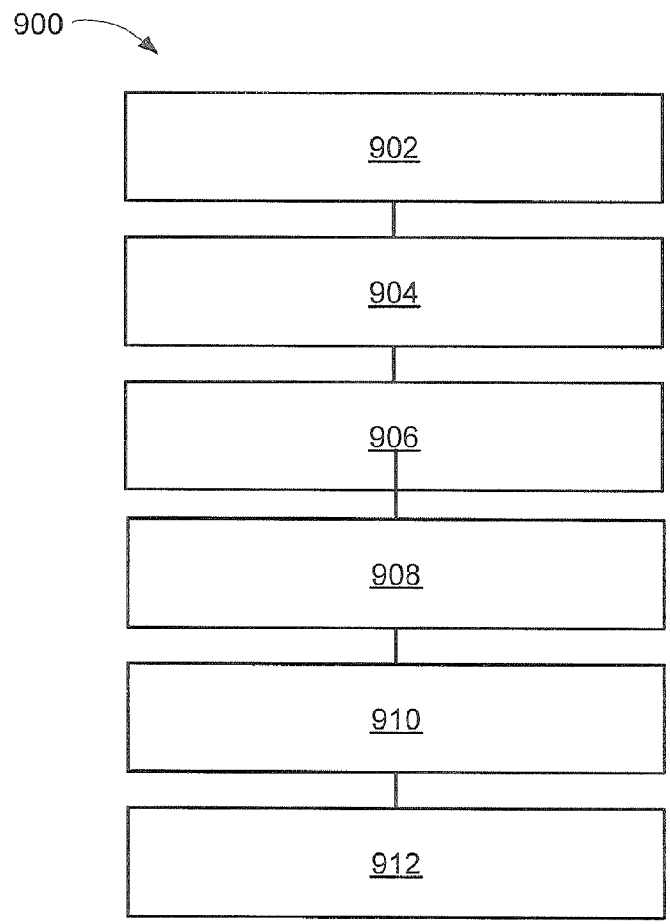
FIG. 9 is a flow chart of a manufacturing process in an embodiment of the present invention.

Referring now to FIG. 9, therein is shown a flow chart of a manufacturing system 900 for a wafer level processing system in an embodiment of the present invention. The system 900 includes placing a wafer on a backgrinding tape in a block 902; backgrinding the wafer in a block 904; mounting the wafer and a wafer frame on a support tape in a block 906; removing the backgrinding tape in a block 908; marking the wafer in a block 910; and singulating the wafer in a block 912.

Figure 10:
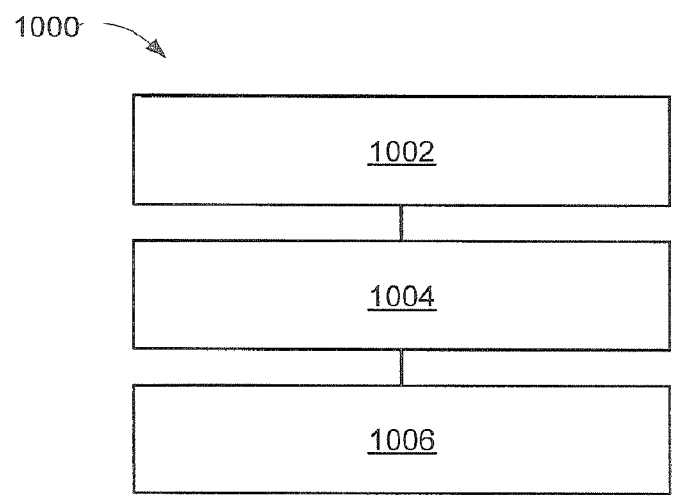
FIG. 10 is a flow chart of a wafer level marking system in an embodiment of the present invention.

Referring now to FIG. 10, therein is shown a flow chart of a wafer level marking system 1000 for a wafer level marking system in an embodiment of the present invention. The system 1000 includes providing a wafer, a wafer frame, and a support tape in a block 1002; mounting the wafer and the wafer frame on the support tape in a block 1004; and marking the wafer through the support tape in a block 1006.

In greater detail, a method to assemble the wafer level marking system 100 utilizing the first support tape 104 according to an embodiment of the present invention is performed as follows:

(1) 1. Starting with attaching the thinned wafer 102 to the first support tape 104 to minimize the wafer warpage, wherein the first support tape 104 providing structural integrity for planar rigidity. (FIG. 1)

(2) 2. Securing the first support tape 104 with the thinned wafer 102 attached, with the first wafer frame mount device 106. (FIG. 1)

(3) 3. Placing the identifying marks on the back side 110 of the thinned wafer 102 through the first support tape 104 utilizing the laser marking system 108. (FIG. 1)

An aspect is the application of the first support tape 104 provides the structural support for planar rigidity generally needed for thinner integrated circuits and more specifically for the application of identifying marks during the laser marking stage. Reliable and readable identifying marks on the wafers and singulated integrated circuits improve the wafer and integrated circuit yield during manufacturing, handling, shipping, integration into the end product, and field returns.

It has been discovered that the wafer level marking system 100 for the thinned wafer 102 using the first support tape 104 allows re-use of existing manufacturing materials, equipments, and processes with minor alterations. This approach does not place limits on the integrated circuit designs fabricated on the wafers as well as being extensible, such as thinner wafer profiles, various wafer sizes, different silicon process technologies, and future silicon process technologies.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the wafer level marking using the support tape method of the present invention furnish important and heretofore unknown and unavailable solutions, capabilities, and functional aspects for increasing chip density in systems while making the multiple device packages easier to manufacture reliably. The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A wafer level marking method comprising:
   providing a wafer, a wafer frame, and a support tape;
   mounting the wafer and the wafer frame on the support tape; and
   marking the wafer directly by optical energy applied to a surface of the wafer through the support tape, wherein the marking occurs as a direct result of an interaction between the optical energy and the wafer.

2. The method as claimed in claim 1 further comprising:
   placing a backgrinding tape on the wafer;
   backgrinding the wafer; and
   removing the backgrinding tape from the wafer after mounting the wafer on the support tape.

3. The method as claimed in claim 1 further comprising:
   providing a computer controlled marking system; and
wherein:
   marking the wafer includes marking the wafer using a laser under computer control.

4. The method as claimed in claim 1 further comprising attaching electrical interconnects to the wafer.

5. The method as claimed in claim 1 further comprising singulating the wafer after marking.

6. A wafer level marking method comprising:
providing a wafer and a wafer frame to support the wafer;
mounting the wafer and the wafer frame on a support tape; and
marking the wafer by application of optical energy to a surface of the wafer through the support tape, wherein the support tape enables laser marking without incinerating the support tape, and wherein the marking occurs as a direct result of an interaction between the optical energy and the wafer.

7. The method as claimed in claim 6 further comprising:
placing a backgrinding tape on the wafer, wherein the backgrinding tape protects the active side of the wafer;
backgrinding the wafer further comprises removing as much as 96% of the wafer material; and
removing the backgrinding tape from the wafer after mounting the wafer on the support tape.

8. The method as claimed in claim 6 further comprising:
providing a computer controlled marking system comprising providing a control device, a camera and a laser source; and
wherein:
marking the wafer includes marking the wafer using a laser controlled by a computer, wherein the back side of the wafer is marked with identifying information.

9. The method as claimed in claim 6 further comprising attaching electrical interconnects to the wafer, wherein the electrical interconnects are wire bond, flip-chip, or wafer level chip scale.

10. The method as claimed in claim 6 further comprises singulating the wafer after marking, wherein the support tape remains intact during marking the wafer and singulating the wafer.

11. A wafer level marking system comprising:
a wafer;
a wafer frame configured to fit around the wafer;
a support tape for supporting the wafer and the wafer frame; and
a marking system for marking the wafer by application of optical energy to a surface of the wafer through the support tape, wherein the marking the wafer occurs as a direct result of an interaction between the optical energy and the wafer.

12. The system as claimed in claim 11 further comprising:
a backgrinding tape on the wafer for wafer backgrinding, and the backgrinding tape is more easily removable from the wafer than the support tape.

13. The system as claimed in claim 11 further comprising:
a computer controlled marking system; and
a laser controlled by the computer controlled marking system for marking the wafer.

14. The system as claimed in claim 11 further comprising:
electrical interconnects attached to the wafer.

15. The system as claimed in claim 11 wherein the wafer is marked without damage to the support tape.

16. The system as claimed in claim 11 wherein the marking system is for forming marks on the wafer without incinerating the support tape.

17. The system as claimed in claim 16 further comprises:
a backgrinding tape on the wafer for protecting the active side of the wafer, and the backgrinding tape is more easily removable from the wafer than the support tape.

18. The system as claimed in claim 16 wherein:
the surface is a back side of the wafer; and
the wafer is marked with identifying information marked on the back side of the wafer.

19. The system as claimed in claim 16 further comprising electrical interconnects attached to the wafer, wherein the electrical interconnects are wire bond, flip-chip, or wafer level chip scale.

20. The system as claimed in claim 16 wherein the wafer is laser marked without incineration of the support tape.

* * * * *